United States Patent
Liu et al.

(10) Patent No.: US 9,536,585 B2
(45) Date of Patent: Jan. 3, 2017

(54) SRAM STORAGE UNIT BASED ON DICE STRUCTURE

(71) Applicant: Institute of Microelectronics, Chinese Academy of Sciences, Beijing (CN)

(72) Inventors: Mengxin Liu, Beijing (CN); Xin Liu, Beijing (CN); Fazhan Zhao, Beijing (CN); Zhengsheng Han, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/904,979

(22) PCT Filed: May 28, 2014

(86) PCT No.: PCT/CN2014/078712
§ 371 (c)(1),
(2) Date: Jan. 14, 2016

(87) PCT Pub. No.: WO2015/172412
PCT Pub. Date: Nov. 19, 2015

(65) Prior Publication Data
US 2016/0260474 A1    Sep. 8, 2016

(30) Foreign Application Priority Data
May 16, 2014    (CN) .......................... 2014 1 0208999

(51) Int. Cl.
*G11C 11/34*    (2006.01)
*G11C 11/419*    (2006.01)

(52) U.S. Cl.
CPC .............. *G11C 11/34* (2013.01); *G11C 11/419* (2013.01)

(58) Field of Classification Search
CPC ................................ G11C 11/419; G11C 11/34
See application file for complete search history.

(56) References Cited

U.S. PATENT DOCUMENTS

| | | | |
|---|---|---|---|
| 2010/0110773 | A1 | 5/2010 | Sachdev et al. |
| 2010/0172195 | A1* | 7/2010 | Moore ................... G11O 5/005 365/189.16 |

FOREIGN PATENT DOCUMENTS

| | | |
|---|---|---|
| CN | 102314538 A | 1/2012 |
| CN | 103337252 A | 10/2013 |
| CN | 103366802 A | 10/2013 |

OTHER PUBLICATIONS

International Search Report mailed Feb. 17, 2015 in International Application PCT/CN2014/078712.

* cited by examiner

*Primary Examiner* — Douglas King
*Assistant Examiner* — Ajay Ojha
(74) *Attorney, Agent, or Firm* — Pillsbury Winthrop Shaw Pittman LLP

(57) ABSTRACT

The present invention provides an improved SRAM memory cell based on a DICE structure, which comprises following structures: four inverter structures formed through arranging PMOS transistors and NMOS transistors in series, wherein the part between the drains of a PMOS transistor and an NMOS transistor serves as a storage node; each storage node controls the gate voltage of an NMOS transistor of the other inverter structure and of a PMOS transistor of another inverter structure; a transmission structure consisting of four NMOS transistors, whose source, gate and drain are respectively connected with a bit line/bit bar line, a word line and a storage node. The use of an improved SRAM memory cell based on a DICE structure not only avoids such defects as small static noise margin and being prone to transmission (Continued)

error facing the traditional cell structures consisting of 6 transistors, but also resolves the problem that the current SRAM storage cells based on a DICE structure can easily be affected by the electrical level of storage nodes. This effectively improves reliability of storage cells.

3 Claims, 3 Drawing Sheets

SRAM STORAGE UNIT BASED ON DICE STRUCTURE

CROSS REFERENCE TO RELATED APPLICATION

This application is a national stage application, filed under 35 U.S.C. §371, of PCT Application No. PCT/CN2014/078712, filed on May 28, 2014, entitled "IMPROVED SRAM STORAGE UNIT BASED ON DICE STRUCTURE", which claimed priority to Chinese Application No. 201410208999.9, filed on May 16, 2014, all of which are hereby incorporated by reference in their entirety.

FIELD OF THE INVENTION

The present invention relates to the technical field of semiconductor technology, particularly, to an improved SRAM memory cell.

BACKGROUND OF THE INVENTION

Integrated circuits are currently the electronic products that are innovated at the fastest speed in the world, whilst a memory device is always the typical product that represents the development level of integrated circuit technology. Advancement of design and manufacturing process of integrated circuits makes it possible to continuously improve storage capacity and performance of SRAM. SRAM becomes the maximum amount of volatile memory device used as computer cache for its fast reading and writing speed. Additionally, SRAM also has been widely applied in electronic products of aviation, telecommunication and consumer electronic goods.

Along with rapid development in the areas of aerospace industry and semiconductor technology, various electronic devices have been applied in space of very harsh conditions, in which various radioactive particles disperse. Radioactive effect would lead to confusion of data inversion in memory cells of semiconductor memory devices and also lead to data transmission error of an entire logic circuit. Accordingly, SRAM designers now are faced with such an unavoidable issue as how to improve radiation resistance of SRAM.

Most of the conventional SRAMs make use of six-transistor units, whose structure is shown in FIG. 1, and are composed of two clamp inverters (M1 and M5 constituting an inverter, whilst M2 and M6 constituting a second inverter) and another two transmission transistors (M3 and M4). A world line WL controls M3 and M4; M3 and M4 are turned on upon operations of reading and writing. At the time of reading, two bit lines BLB and BL are both pre-charged to a high electric level. When 1 is written in, BL=1, BLB=0; when 0 is written in, BL=0, BLB=1.

For the current SRAM memory cells, BL and BLB are pre-charged to Vdd/2 at the time of reading operations. The voltage of the node storing 0 rises because of voltage-split principles in transistors, which consequently reduces the static noise margin. As shown in FIG. 1, two bit lines BL and BLB are individually charged to Vdd/2 at the time of reading operations. If the memory value of a memory node Q on the left is 1, the memory value of the memory node QB on the right is 0, then WL=1, M5 is turned on at the time of reading; since Q stores 1, the gate voltage of the M2 transistor is in an ON state all the time; when BLB reads 0 stored in QB, it is charged to a high electric level; therefore, M2 and M4 form a discharge path, and the voltage of QB rises from 0. If the voltage of QB rises to a certain level, it may turn M1 on, and the potential of the node Q is driven down, which consequently causes data stored in the entire SRAM flip and thence leads to data transmission errors.

Therefore, at the time of reading, the voltage of a node storing 0 rises to a certain level between 0 and Vdd/2, the exact figure of which depends on the conducting resistance between M2 and M4. In this case, if this node is further interfered by a noise voltage, flip is more likely to happen; consequently, the static noise margin is reduced. Likewise, the issue of voltage change also happens to storage nodes at the time of reading "1". As shown in FIG. 1, BL and BLB are pre-charged to Vdd/2 before the stored data is read; if Q=1, QB=0, then M3 and M5 are turned on, and the potential of Q point is at a level between Vdd/2 and Vdd, the exact figure of which depends on the conducting resistances of M3 and M5.

FIG. 2 illustrates an SRAM cell designed on the basis of a dual interlocked storage cell (DICE) structure in the prior art, in which four inverters constitute four storage nodes A, B, C, D. According to the design scheme, the potentials of A and C should be the same, while the potentials of B and D should be the same. Discussion about different situations is to be given below on the basis of different initial values of A, B, C, D.

☐ Assume initial conditions are that A=1, B=0, C=1, D=0. It can be seen that A controls the turning on of N8 and drives D node down to 0; and at the meantime, D controls the turning on of P1 and drives Node A up to a high electric level; therefore, A and D control each other when they are respectively 1 and 0. Likewise, B and C also control each other. ② If A=0, B=1, C=0, D=1, then A=0 enables P2 to drive B up to 1, while B turns N1 on and drives A down to 0; Likewise, C and D also control each other in this case.

In situation ☐, if B flips to 1, it cannot be restored except by a feedback from C to B. If B flips to 0, it may turn P3 on because of a fairly large instant current, and C is driven up to 1. In this case, the entire BC feedback becomes ineffective. Because A and D are a pair of controlling nodes, while B and C are a pair of controlling nodes. A and D are incapable of restoring flip of B. The similar problem would also happen in situation ②.

Accordingly, it is desirable to propose an SRAM cell structure that has a relatively large static noise margin and is resistant of influence from initial electric level of nodes.

SUMMARY OF THE INVENTION

The present invention is intended to provide an improved SRAM memory cell based on a DICE structure, which comprises following structures:

an inverter structure comprising a first inverter structure, a second inverter structure, a third inverter structure and a fourth inverter structure, wherein:

the first inverter structure is formed through arranging a first PMOS transistor P1 and a first NMOS transistor N1 in series; the source of the first PMOS transistor P1 is connected with a power supply VDD, and the source of the first NMOS transistor N1 is connected to ground; the part between the drain of the first PMOS transistor P1 and the drain of the first NMOS transistor N1 serves as a first storage node A;

the second inverter structure is formed through arranging a second PMOS transistor P2 and a second NMOS transistor N2 in series; the source of the second PMOS transistor P2 is connected with a power supply VDD, and the source of the second NMOS transistor N2 is connected to ground; the part between the drain of the second PMOS transistor P2 and the drain of the second NMOS transistor N2 serves as a second storage node B;

the third inverter structure is formed through arranging a third PMOS transistor P3 and a third NMOS transistor N3 in series; the source of the third PMOS transistor P3 is connected with a power supply VDD, and the source of the third NMOS transistor N3 is connected to ground; the part between the drain of the third PMOS transistor P3 and the drain of the third NMOS transistor N3 serves as a third storage node C;

the fourth inverter structure is formed through arranging a fourth PMOS transistor P4 and a fourth NMOS transistor N4 in series; the source of the fourth PMOS transistor P4 is connected with a power supply VDD, and the source of the fourth NMOS transistor N4 is connected to ground; the part between the drain of the fourth PMOS transistor P4 and the drain of the fourth NMOS transistor N4 serves as a fourth storage node D;

the first storage node A is connected with the gate electrodes of the second PMOS transistor and the fourth NMOS transistor;

the second storage node B is connected with the gate electrodes of the first PMOS transistor and the third NMOS transistor;

the third storage node C is connected with the gate electrodes of the fourth PMOS transistor and the second NMOS transistor;

the fourth storage node D is connected with the gate electrodes of the third PMOS transistor and the first NMOS transistor;

a transmission structure consisting of a fifth NMOS transistor N5, a sixth NMOS transistor N6, a seventh NMOS transistor N7, and an eighth NMOS transistor N8; wherein, the drain of the fifth NMOS transistor N5 is connected with the first storage node A, and the source thereof is connected with a bit line BL;

the drain of the sixth NMOS transistor N6 is connected with the second storage node B, and the source thereof is connected with a bit bar line BLB;

the drain of the seventh NMOS transistor N7 is connected with the third storage node C, and the source thereof is connected with a bit line BL;

the drain of the eighth NMOS transistor N8 is connected with the fourth storage node D, and the source thereof is connected with a bit bar line BLB;

The gates of the fifth NMOS transistor N5, the sixth NMOS transistor N6, the seventh NMOS transistor N7 and the eighth NMOS transistor N8 are all connected with a word line WL.

As compared to the prior art, the technical solution provided by the present invention has following advantages: the use of an improved SRAM memory cell based on a DICE structure not only avoids such defects as small static noise margin and being prone to transmission error facing the traditional cell structure consisting of six transistors, but also resolves the problem that the current SRAM memory cells based on a DICE structure would easily be affected by electrical levels of storage nodes. This effectively improves reliability of the memory cell.

BRIEF DESCRIPTION OF THE DRAWINGS

Other additional features, aspects and advantages of the present invention are made more evident according to perusal of the following detailed description of exemplary embodiment(s) in conjunction with the appended drawings.

DETAILED DESCRIPTION OF THE INVENTION

Embodiments of the present invention are to be described here below.

Examples of the embodiments are illustrated in the appended drawings, in which the same or similar reference signs throughout denote the same or similar elements or elements having same or similar functions. It should be appreciated that embodiments described below in conjunction with the appended drawings are illustrative, and are provided for explaining the present invention only, thus they shall not be interpreted as a limit to the present invention. Various embodiments or examples are provided here below to implement different structures of the present invention. To simplify the disclosure of the present invention, descriptions of components and arrangements of specific examples are given below. Of course, they are illustrative only and not limiting the present invention. Moreover, in the present invention, reference numbers and/or letters may be repeated in different examples. Such repetition is for purposes of simplicity and clarity, yet does not denote any relationship between respective embodiments and/or arrangements under discussion. Furthermore, the present invention provides various examples for various processes and materials. However, it is obvious for a person of ordinary skills in the art that other processes and/or materials may be alternatively utilized.

Figure 1:
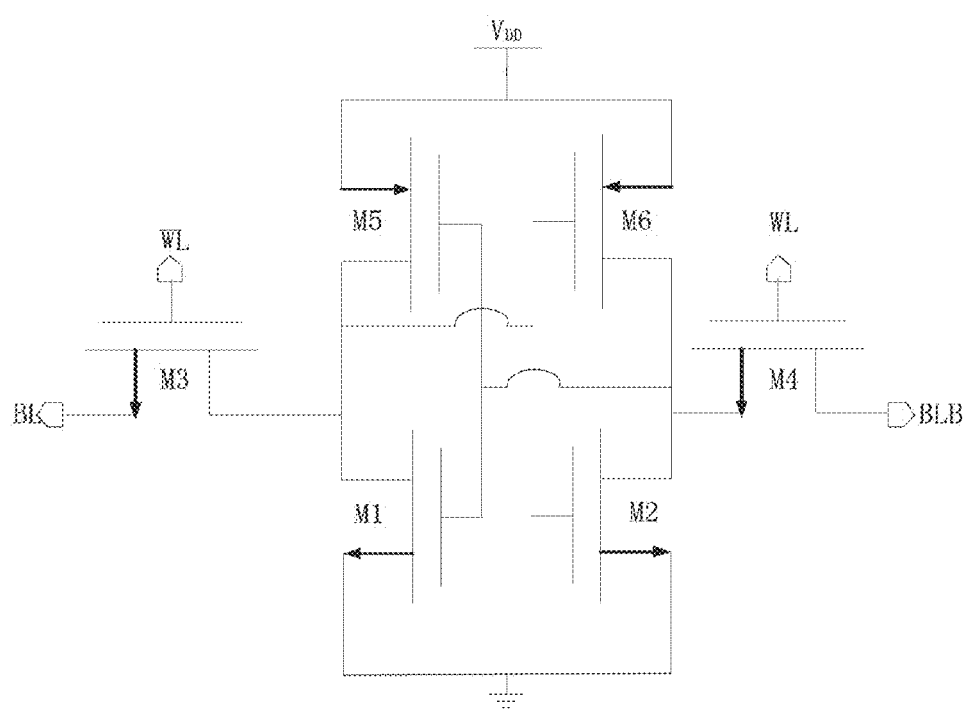
FIG. 1 illustrates a structural diagram of a SRAM cell of a structure of six transistors in the prior art.
Figure 2:
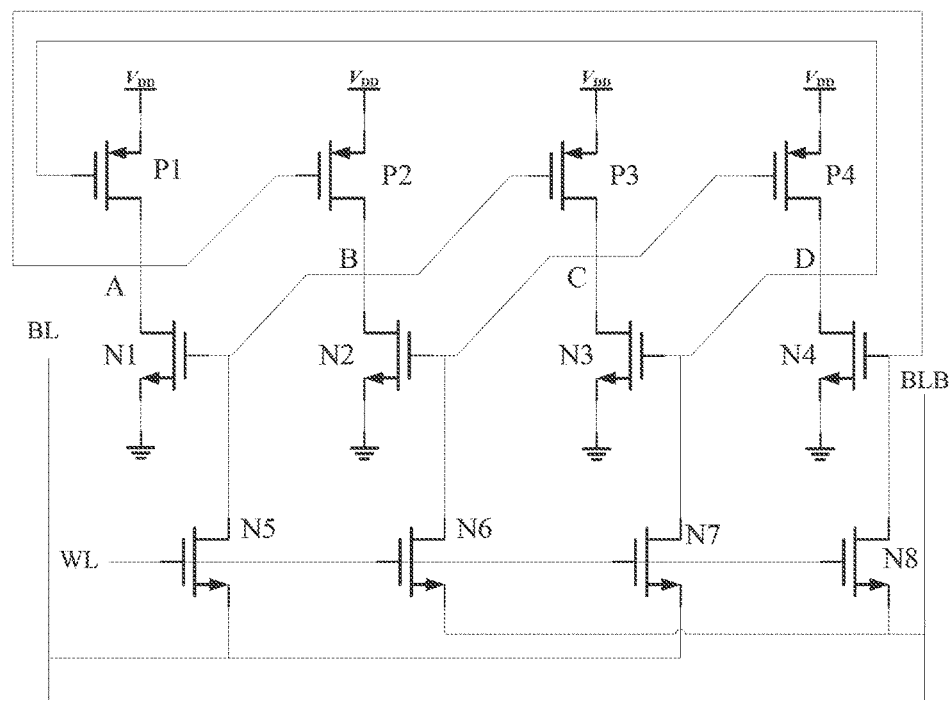
FIG. 2 illustrates a structural diagram of a SRAM cell of four storage nodes based on a DICE structure in the prior art.
Figure 3:
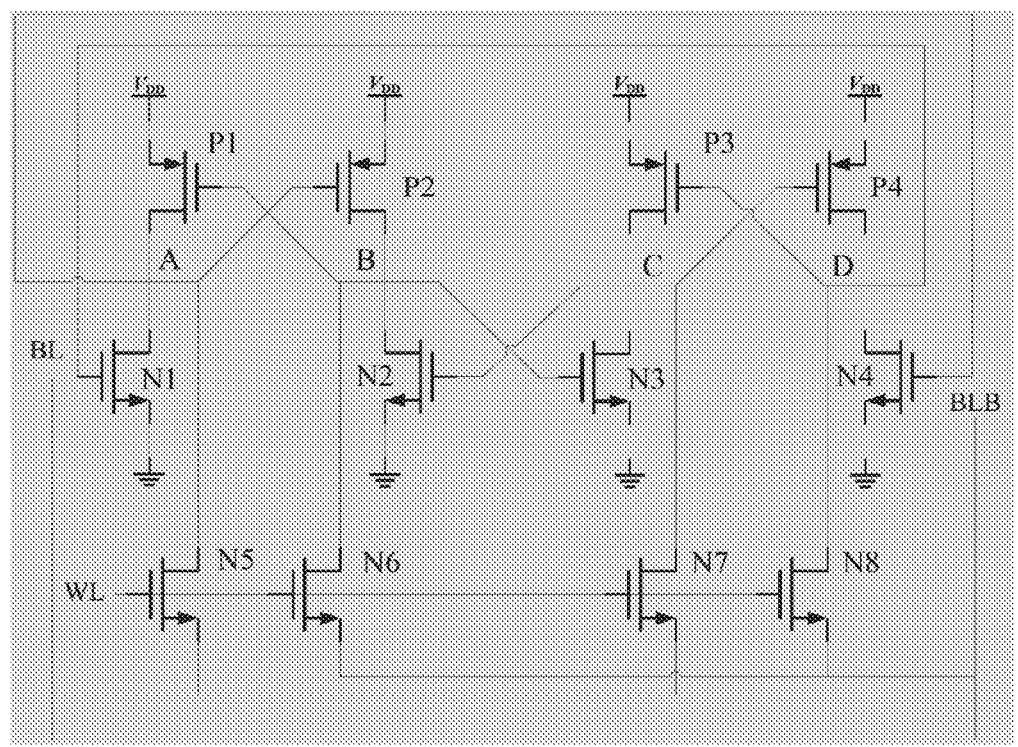
FIG. 3 illustrates a structural diagram of an improved SRAM cell of four storage nodes based on a DICE structure according to the embodiments of the present invention.

The present invention provides an improved SRAM memory cell based on a DICE structure. Here below, an improved SRAM memory cell based on a DICE structure as illustrated in FIG. 3 is to be described in detail with an embodiment of the present invention. As shown in FIG. 3, the improved SRAM memory cell based on a DICE structure provided by the present invention comprises:

an inverter structure and a transmission structure, wherein the inverter structure uses two-transistor inverters to form a feedback loop and form a latch structure. There are four nodes storing logic states in each cell as such a structure is used, wherein the state of each node is controlled by a neighbouring node located on a diagonal line, whilst nodes located on diagonal lines are not connected with each other and their states are controlled by other neighbouring nodes located on a diagonal line. At the time of reading operations, the electric level state stored in the storage nodes and information from bit lines or bit bar lines transmitted to each other via the transmission structure. These two structures are described separately here below in detail.

An inverter structure for latch of logic state information comprises a first inverter structure, a second inverter structure, a third inverter structure and a fourth inverter structure; wherein, The first inverter structure is formed by arranging a first PMOS transistor P1 and a first NMOS transistor N1 in series; the source of the first PMOS transistor P1 is connected with a power supply VDD, and the source of the first NMOS transistor N1 is connected to ground; the part between the drain of the first PMOS transistor P1 and the drain of the first NMOS transistor N1 serves as a first storage node A. The second inverter structure is formed by arranging a second PMOS transistor P2 and a second NMOS transistor N2 in series; the source of the second PMOS transistor P2 is connected with a power supply VDD, and the source of the second NMOS transistor N2 is connected to ground; the part between the drain of the second PMOS transistor P2 and the drain of the second NMOS transistor N2 serves as a second storage node B. The third inverter structure is formed by arranging a third PMOS transistor P3 and a third NMOS transistor N3 in series; the source of the third PMOS transistor P3 is connected with a power supply VDD, and the source of the third NMOS transistor N3 is connected to ground; the part between the drain of the third PMOS transistor P3 and the drain of the third NMOS transistor N3 serves as a third storage node C. The fourth inverter structure is formed by arranging a fourth PMOS transistor P4 and a fourth NMOS transistor N4 in series; the source of the fourth PMOS transistor P4 is connected with a power supply VDD, and the source of the fourth NMOS transistor N4 is connected to ground; the part between the drain of the fourth PMOS transistor P4 and the drain of the fourth NMOS transistor N4 serves as a fourth storage node D.

wherein the first storage node A is connected with the gate electrodes of the second PMOS transistor and the fourth NMOS transistor; the second storage node B is connected with the gate electrodes of the first PMOS transistor and the third NMOS transistor; the third storage node C is connected with the gate electrodes of the fourth PMOS transistor and the second NMOS transistor; and the fourth storage node D is connected with the gate electrodes of the third PMOS transistor and the first NMOS transistor.

The transmission structure for transmitting logic electric level states stored in storage nodes and information from bit lines or bit bar lines comprises a fifth NMOS transistor N5, a sixth NMOS transistor N6, a seventh NMOS transistor N7 and an eighth NMOS transistor N8; wherein, the drain of the fifth NMOS transistor N5 is connected with the first storage node A, and the source thereof is connected with a bit line BL; the drain of the sixth NMOS transistor N6 is connected with a second storage node B, and the source is connected with a bit bar line BLB; the drain of the seventh NMOS transistor N7 is connected with a third storage node C, and the source thereof is connected with a bit line BL; the drain of eighth NMOS transistor N8 is connected with a fourth storage node D, and the source thereof is connected with a bit bar line BLB. The gates of the fifth NMOS transistor N5, the sixth NMOS transistor N6, the seventh NMOS transistor N7, and the eighth NMOS transistor N8 are all connected with a word line WL.

When reading and writing operations are made to such a memory cell, the transmission structure, namely, the fifth NMOS transistor N5, the sixth NMOS transistor N6, the seventh NMOS transistor N7 and the eighth NMOS transistor N8, is turned on; at the time of reading, the bit bar lines BLB and bit lines BL are all pre-charged to a high electric level; at the time of writing, BL=1, BLB=0 for the node to which 1 is to be written in; BL=0, BLB=1 for the node to which 0 is to be written in.

Discussion of cases is to be provided below on the basis of analysis method of SRAM cell based on a traditional DICE structure design in the part of Background of the Invention and different initial values of the four storage nodes A, B, C, D.

Case 1: Assume initial conditions are A=1, B=0, C=1, D=0. It can be seen that A controls the fourth NMOS transistor N4 to drive D down to 0, D controls the third PMOS transistor P3 to drive C up to 1, while C controls the second NMOS transistor N2 to drive B down to 0, and B controls the first PMOS transistor P1 to drive A up to 1. In this case, if A flips to 0, A would attempt to drive B up to 1, but B is kept at 0 via turning on the second NMOS transistor N2 because C still keeps 1. Therefore, the potential of B is controlled by two nodes; once a transient current disappears, B keeps to be 0 under the control of C, then the first PMOS transistor P1 can be turned on to drive A up to 1. Since A changes from 1 to 0, it can only controls B but is unable to influence C or D. Analogous analysis may be done for the other three nodes.

Case two: assume initial conditions are: A=0, B=1, C=0, D=1. Analogous analysis shows that the initial condition for mutual control is stability. In this case, if A flips to 1, then A would attempt to turn on the fourth NMOS transistor N4 to drive D down to 0, but as D is still under control of C and C=0 enables to turn on the fourth PMOS transistor P4 and to keep D at 1. Accordingly, after a transient current passes, D can restore A to 0. Analogous analysis may be done for the other three nodes.

As compared to the prior art, the present invention exhibits following advantages: the use of an improved SRAM memory cell based on a DICE structure not only avoids such defects as small static noise margin and being prone to transmission error facing traditional cell structures consisting of 6 transistors, but also resolves the problem that the current SRAM storage cells based on a DICE structure can easily be affected by the electrical level of storage nodes. This effectively improves reliability of storage cells.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate that the process, mechanism, manufacture, material composition, means, methods and steps currently existing or to be developed in future, which perform substantially the same functions or achieve substantially the same outcome as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. An improved SRAM memory cell based on a DICE structure comprising the following structure:
   an inverter structure for latch of logic level states, comprising a first inverter structure, a second inverter structure, a third inverter structure, and a fourth inverter structure; wherein the first inverter structure is formed through arranging a first PMOS transistor (P1) and a first NMOS transistor (N1) in series; the part between the drain of the first PMOS transistor (P1) and the drain of the first NMOS transistor (N1) serves as a first storage node (A);

the second inverter structure is formed through arranging a second PMOS transistor (P2) and a second NMOS transistor (N2) in series; the part between the drain of the second PMOS transistor (P2) and the drain of the second NMOS transistor (N2) serves as a second storage node B;

the third inverter structure is formed through arranging a third PMOS transistor (P3) and a third NMOS transistor (N3) in series; the part between the drain of the third PMOS transistor (P3) and the drain of the third NMOS transistor (N3) serves as a third storage node C;

the fourth inverter structure is formed through arranging a fourth PMOS transistor (P4) and a fourth NMOS transistor (N4) in series; the part between the drain of the fourth PMOS transistor (P4) and the drain of the fourth NMOS transistor (N4) serves as a fourth storage node D;

the first storage node (A) is connected with the gate electrodes of the second PMOS transistor and the fourth NMOS transistor;

the second storage node (B) is connected with the gate electrodes of the first PMOS transistor and the third NMOS transistor;

the third storage node (C) is connected with the gate electrodes of the fourth PMOS transistor and the second NMOS transistor; and the fourth storage node (D) is connected with the gate electrodes of the third PMOS transistor and the first NMOS transistor;

a transmission structure, for transmitting logic level states stored in storage nodes and information from bit lines or bit bar lines, consisting of a fifth NMOS transistor (N5), a sixth NMOS transistor (N6), a seventh NMOS transistor (N7), and an eighth NMOS transistor (N8).

2. The improved SRAM memory cell of claim 1, wherein the inverter structure is characterized in that:

the source of the first PMOS transistor (P1) is connected with a power supply (VDD), and the source of the first NMOS transistor (N1) is connected to ground; the drain of the first PMOS transistor (P1) is connected with the drain of the first NMOS transistor (N1);

the source of the second PMOS transistor (P2) is connected with a power supply (VDD), and the source of the second NMOS transistor (N2) is connected to ground; the drain of the second PMOS transistor (P2) is connected with the drain of the second NMOS transistor (N2);

the source of the third PMOS transistor (P3) is connected with a power supply (VDD), and the source of the third NMOS transistor (N3) is connected to ground; the drain of the third PMOS transistor (P3) is connected with the drain of the third NMOS transistor (N3); and the source of the fourth PMOS transistor (P4) is connected with a power supply (VDD), and the source of the fourth NMOS transistor (N4) is connected to ground; the drain of the fourth PMOS transistor (P4) is connected with the drain of the fourth NMOS transistor (N4).

3. The improved SRAM memory cell of claim 1, wherein the transmission structure is characterized in that:

the drain of the fifth NMOS transistor (N5) is connected with the first storage node (A), and the source thereof is connected with a bit line (BL);

the drain of the sixth NMOS transistor (N6) is connected with the second storage node (B), and the source thereof is connected with a bit bar line (BLB);

the drain of the seventh NMOS transistor (N7) is connected with the third storage node (C), and the source thereof is connected with a bit line (BL);

the drain of the eighth NMOS transistor (N8) is connected with the fourth storage node (D), and the source thereof is connected with a bit bar line (BLB); and the gates of the fifth NMOS transistor (N5), the sixth NMOS transistor (N6), the seventh NMOS transistor (N7), and the eighth NMOS transistor (N8) are all connected with a word line (WL).

* * * * *